(12) United States Patent
Lin et al.

(10) Patent No.: US 10,925,150 B2
(45) Date of Patent: Feb. 16, 2021

(54) ANTI-PAD FOR A PRINTED CIRCUIT BOARD

(71) Applicant: TE CONNECTIVITY CORPORATION, Berwyn, PA (US)

(72) Inventors: Bin Lin, Hummelstown, PA (US); Bernard Wilhelm Vetten, Sunnyvale, CA (US); Eric DiBiaso, Lebanon, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 16/514,250

(22) Filed: Jul. 17, 2019

(65) Prior Publication Data

US 2021/0022240 A1 Jan. 21, 2021

(51) Int. Cl.
*H05K 1/02* (2006.01)

(52) U.S. Cl.
CPC ......... *H05K 1/0222* (2013.01); *H05K 1/0298* (2013.01)

(58) Field of Classification Search
CPC .... H05K 1/0251; H05K 1/0245; H05K 1/115; H05K 1/116; H05K 1/0222; H05K 1/0298
See application file for complete search history.

(56) References Cited

U.S. PATENT DOCUMENTS

| 2017/0265296 A1* | 9/2017 | Charbonneau ....... H05K 1/0245 |
| 2019/0116668 A1* | 4/2019 | Lizalde Moreno .. H05K 3/4038 |

\* cited by examiner

*Primary Examiner* — Timothy J Thompson
*Assistant Examiner* — Amol H Patel

(57) ABSTRACT

A printed circuit board includes a substrate having a plurality of stacked circuit board layers. The substrate has a top surface and a bottom surface. The printed circuit board includes a signal contact on the substrate. The signal contact has a signal via and a signal trace extending from the signal via. The signal via extends between the top surface and the bottom surface along a via axis. The printed circuit board includes an anti-pad around the signal via extending through the substrate along the via axis. The anti-pad extends between the top surface and the bottom surface. The anti-pad has a first width at the top surface and the lower anti-pad has a second width at the bottom surface different than the first width.

19 Claims, 3 Drawing Sheets

ANTI-PAD FOR A PRINTED CIRCUIT BOARD

BACKGROUND OF THE INVENTION

The subject matter herein relates generally to printed circuit boards.

In general, a printed circuit board ("PCB") refers to a component onto which various elements are mounted or electrically connected through integrated wiring. PCBs generally provide a reliable and economical means of interconnecting electrical signals between system components. With technological development, the PCBs are being manufactured to have greater numbers of layers to reduce the PCB board size while accommodating greater components for miniaturization and highspeed applications. Multilayer PCBs are manufactured to include multiple layers of insulating material upon which patterns of electrical conductors are formed. In addition to a pattern of conductive traces on the PCB, a patterned array of metal-filled through-holes, or vias, may be formed to allow for layer-to-layer interconnections between various conductive features. Anti-pads are provided that surround the vias and provide separation between the vias and other conductive layers of the PCB. The anti-pads affect impedance of the signal transmission line through the via. A signal trace extends from each signal via. Some known PCBs vary the width of the signal trace to optimize electrical performance. However, for high layer PCBs signal impedance control is problematic. Additionally, impedance control provided by the signal trace occupies valuable real estate on the substrate, which may limit positioning of other signal vias and ground vias.

A need remains for a PCB having improved impedance control.

BRIEF DESCRIPTION OF THE INVENTION

In one embodiment, a printed circuit board is provided. The printed circuit board includes a substrate having a plurality of stacked circuit board layers. The substrate has a top surface and a bottom surface. The printed circuit board includes a signal contact on the substrate. The signal contact has a signal via and a signal trace extending from the signal via. The signal via extends between the top surface and the bottom surface along a via axis. The printed circuit board includes an anti-pad around the signal via extending through the substrate along the via axis. The anti-pad extends between the top surface and the bottom surface. The anti-pad has a first width at the top surface and the lower anti-pad has a second width at the bottom surface different than the first width.

In another embodiment, a printed circuit board is provided. The printed circuit board includes a substrate having a top surface and a bottom surface. The substrate has a plurality of stacked circuit board layers including an upper board stack at the top surface and a lower board stack at the bottom surface. The printed circuit board includes a signal contact on the substrate. The signal contact has a signal via and a signal trace extending from the signal via. The signal via includes an upper signal via through the upper board stack and a lower via through the lower board stack. The upper via and the lower via are aligned along a via axis. The printed circuit board includes an anti-pad around the signal via extending through the substrate along the via axis. The anti-pad has an upper anti-pad aligned with the upper via and a lower anti-pad aligned with the lower via. the upper anti-pad has a first width and the lower anti-pad has a second width different than the first width.

In a further embodiment, an electrical connector assembly is provided. The electrical connector includes a housing holding signal contacts and ground contacts. The housing has a mounting end. The electrical connector assembly includes a printed circuit board supporting the electrical connector. The printed circuit board includes a substrate having a plurality of stacked circuit board layers. The substrate has a top surface and a bottom surface. The mounting end of the electrical connector are mounted to the top surface of the substrate. The printed circuit board includes signal contacts and ground contacts. The signal contacts of the printed circuit board are electrically coupled to corresponding signal contacts of the electrical connector. The ground contacts of the printed circuit board are electrically coupled to corresponding ground contacts of the electrical connector. Each signal contact has a signal via extending between the top surface and the bottom surface along a via axis and a signal trace extending from the signal via. The printed circuit board includes anti-pads around the corresponding signal vias. The anti-pads extend through the substrate along the corresponding via axis between the top surface and the bottom surface. The anti-pads have stepped profiles through the substrate with varying widths along the heights of the anti-pads.

DETAILED DESCRIPTION OF THE INVENTION

Figure 1:
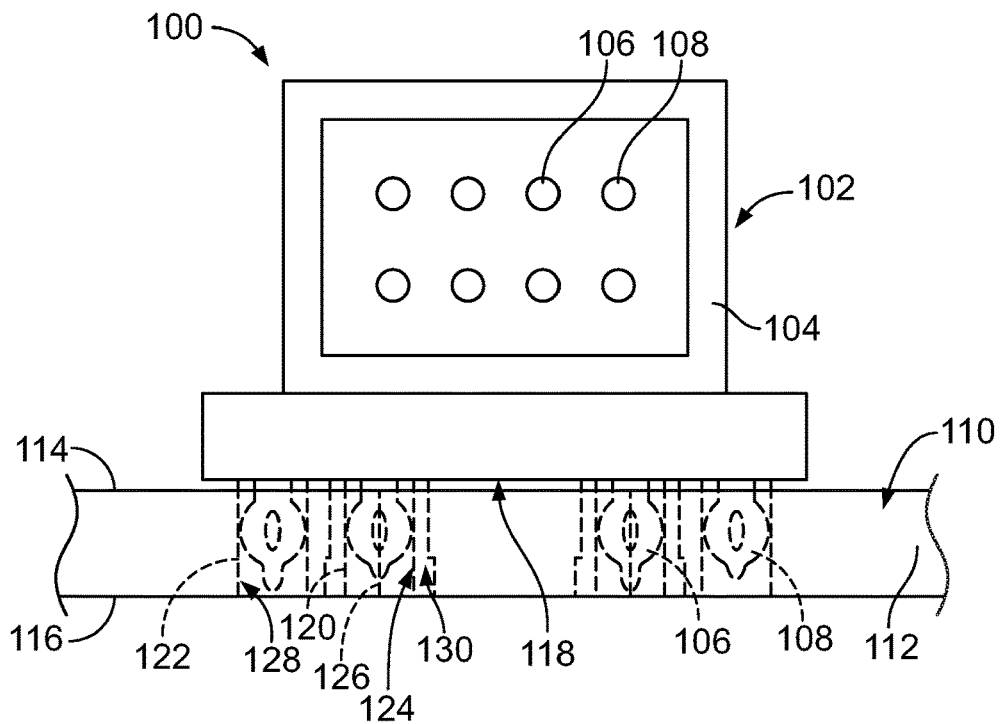
FIG. 1 is a side view of an electrical connector assembly including a printed circuit board (PCB) in accordance with an exemplary embodiment.

FIG. 1 is a side view of an electrical connector assembly 100 including a printed circuit board (PCB) 110 in accordance with an exemplary embodiment. The electrical connector assembly 100 includes an electrical connector 102 having a housing 104 holding signal contacts 106 and ground contacts 108. The signal contacts 106 and the ground contacts 108 have mating ends configured to be mated with a mating electrical connector. The signal contacts 106 and the ground contacts 108 have mounting ends configured to be mounted to the PCB 110. For example, the mounting ends of the signal contacts 106 and the ground contacts 108 may be defined by compliant pins, such as eye of the needle pins, configured to be press-fit into plated vias of the PCB 110. In other various embodiments, the mounting ends of the signal contacts 106 and/or the ground contacts 108 may be other types, such as solder tails.

The PCB 110 supports the electrical connector 102. The PCB 110 includes a substrate 112 having a top surface 114 and a bottom surface 116. The substrate 112 has a plurality of stacked circuit board layers forming the substrate 112. The substrate 112 may include any number of circuit board layers and, in an exemplary embodiment, includes a high number of circuit board layers, such as greater than ten circuit board layers. A mounting end 118 of the electrical connector 102 is mounted to the top surface 114 of the substrate 112.

The PCB 110 includes signal contacts 120 and ground contacts 122 (shown in phantom). The signal contacts 120 of the PCB 110 are electrically connected to corresponding signal contacts 106 of the electrical connector 102. The ground contacts 122 of the PCB 110 are electrically connected to corresponding ground contacts 108 of the electrical connector 102. Each signal contact 120 includes a signal via 124 extending between the top surface 114 and the bottom surface 116 along a via axis 126. The signal via 124 receives the signal contact 106 of the electrical connector 102. In an exemplary embodiment, the signal via 124 is plated to electrically connect to the signal contact 106 of the electrical connector 102. Each ground contact 122 includes a ground via 128 extending between the top surface 114 and the bottom surface 116. In an exemplary embodiment, the ground via 128 is plated to electrically connect to the ground contact 108 of the electrical connector 102.

In an exemplary embodiment, the PCB 110 includes anti-pads 130 (shown in phantom) around the corresponding signal vias 124. The anti-pads 130 are void areas or keep-out areas around the signal via 124 that are devoid of the ground contacts 122 and ground planes along various layers of the substrate 112. The anti-pads 130 extend through the substrate 112 along the corresponding via axis 126 between the top surface 114 and the bottom surface 116. In the illustrated embodiment, each anti-pad 130 surrounds a corresponding signal via 124. In alternative embodiments, multiple signal vias 124 may be provided within a corresponding anti-pad 130. For example, a pair of signal vias 124 may be arranged within a single anti-pad 130.

In an exemplary embodiment, each anti-pad 130 has a stepped profile through the substrate 112 with a varying width along the height of the anti-pad 130. For example, each anti-pad 130 may have a first width at the top surface 114 and a second width at the bottom surface 116 that is different than the first width. While the anti-pad 130 is illustrated as having a single step (for example, areas having two different widths), it is realized that the anti-pad 130 may have multiple steps in alternative embodiments.

The stepped structure of the anti-pad 130 varies the distance or spacing between the signal via 124 and ground planes and/or the ground via 128, which affects impedance of the signal transmission lines through the signal via 124. The ground via 128 is positioned at variable distances from the anti-pad 130 along the height. For example, the ground via 128 is positioned a first distance from the anti-pad 130 at the top surface 114 and is positioned a second distance from the anti-pad 130 at the bottom surface 116 that is different than the first distance.

Figure 2:
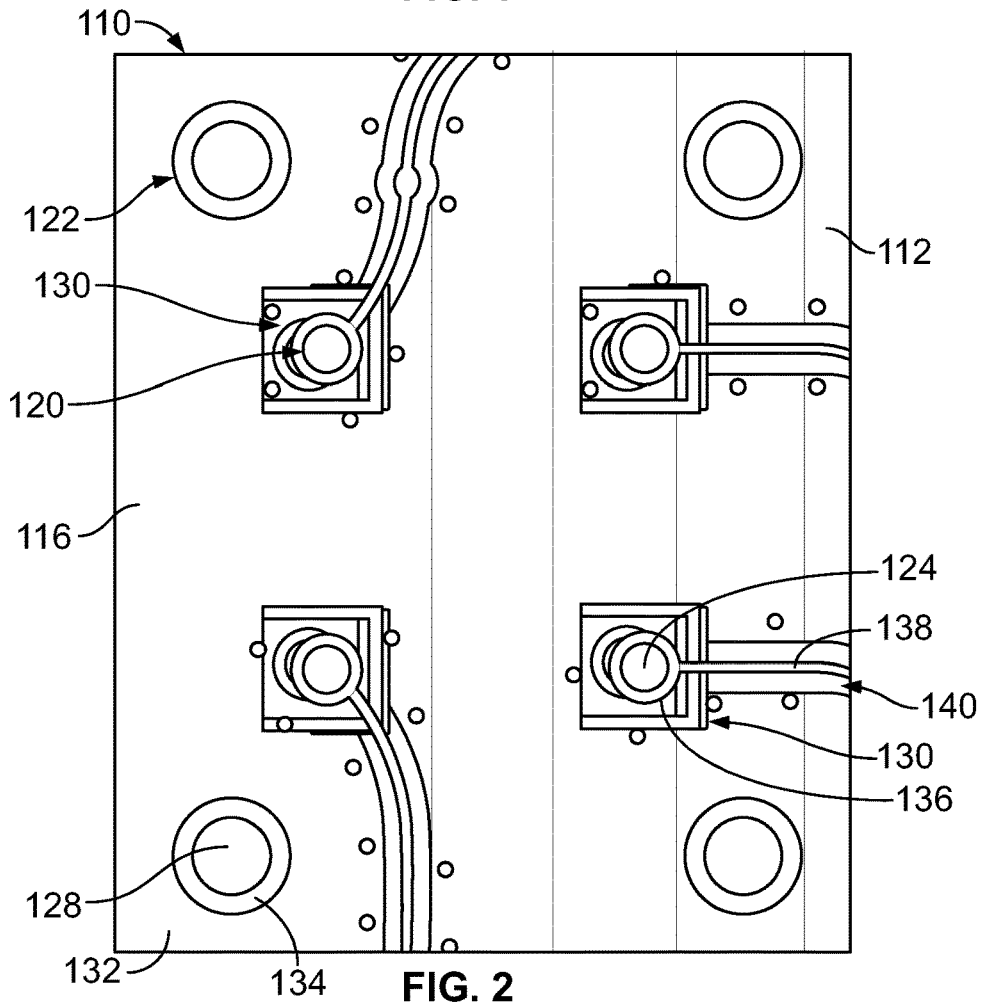
FIG. 2 is a bottom, perspective view of the PCB in accordance with an exemplary embodiment.

FIG. 2 is a bottom, perspective view of the PCB 110 in accordance with an exemplary embodiment. FIG. 2 illustrates the signal contacts 120 and the ground contacts 122 at the bottom surface 116 of the substrate 112. In an exemplary embodiment, the PCB 110 includes one or more ground planes 132, such as at one or more layers of the substrate 112. In an exemplary embodiment, the PCB 110 includes one of the ground planes 132 at the bottom surface 116. The ground plane 132 is electrically connected to the ground contacts 122. In an exemplary embodiment, each ground contact 122 includes a ground pad 134 electrically connected to the ground plane 132. The ground plane 132 electrically connects each of the ground contacts 122.

In an exemplary embodiment, each signal contact 120 includes a signal pad 136 and a signal trace 138. In the illustrated embodiment, the signal pad 136 and the signal trace 138 are provided at the bottom surface 116. The signal pad 136 and the signal trace 138 may be provided at the top surface 114 or may be provided at an inner layer of the stack of circuit board layers of the substrate 112 in other various embodiments. The signal trace 138 is routed along the corresponding layer of the substrate 112 to another location remote from the signal via 124. In an exemplary embodiment, the signal trace 138 has a trace anti-pad 140 extending along the signal trace 138 on the corresponding layer of the substrate 112 to isolate the signal trace 138 from the ground plane 132. The trace anti-pad 140 is different from the anti-pad 130 of the signal via 124 in that the trace anti-pad 140 is only provided on a single layer of the substrate 112 rather than extending entirely through the substrate 112.

Figure 3:
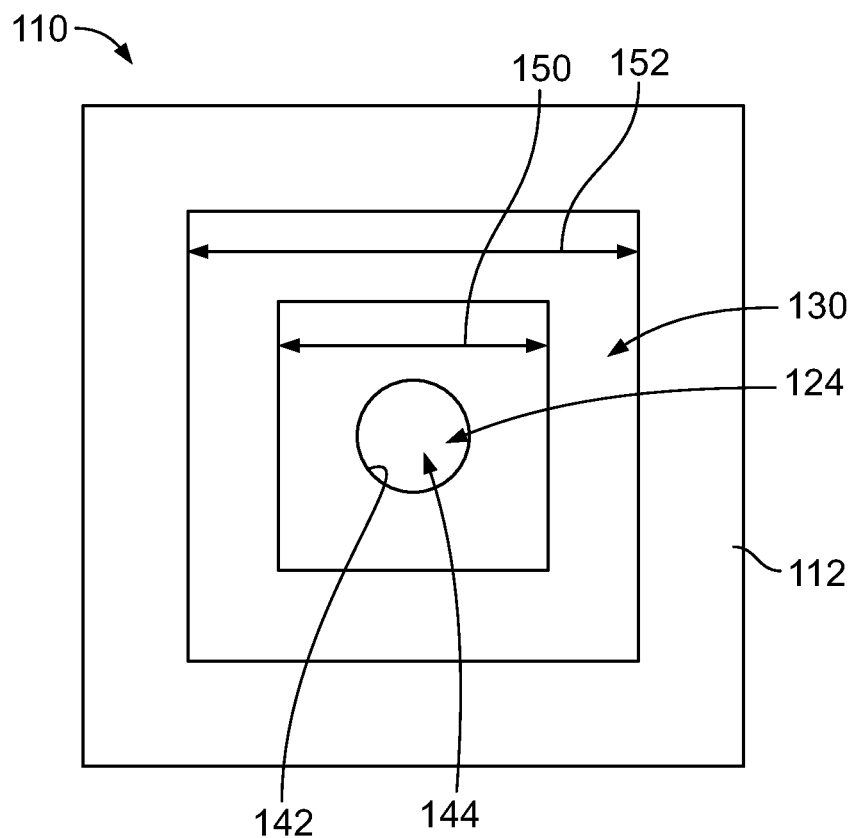
FIG. 3 is a bottom view of a portion of the PCB in accordance with an exemplary embodiment.

FIG. 3 is a bottom view of a portion of the PCB 110 in accordance with an exemplary embodiment. FIG. 3 illustrates the signal via 124 and the anti-pad 130 around the signal via 124. In the illustrated embodiment, the signal via 124 is cylindrical. The signal via 124 is defined by plating 142 of a through hole 144 extending through the substrate 112. The through hole 144 is configured to receive the signal contact 106 (shown in FIG. 1) such that the signal contact 106 directly engages the plating 142 to electrically connect the signal contact 106 with the signal via 124.

The anti-pad 130 completely surrounds the signal via 124. In an exemplary embodiment, the anti-pad 130 is coincident with the via axis 126. For example, a centroid of the anti-pad 130 is coincident with the via axis 126. In the illustrated embodiment, the anti-pad 130 is parallelepiped. The anti-pad 130 may have a rectangular cross-section. Optionally, the anti-pad 130 may have a square cross-section. The anti-pad 130 may have other shapes in alternative embodiments. In an exemplary embodiment, the anti-pad 130 has a variable width. For example, the anti-pad 130 has a first width 150 along a portion thereof and a second width 152 along a different portion thereof. In the illustrated embodiment, the first width 150 is narrower than the second width 152. The anti-pad 130 may have the first width 150 along one or more layers of the substrate 112 and the second width 152 along one or more layers of the substrate 112.

Figure 4:
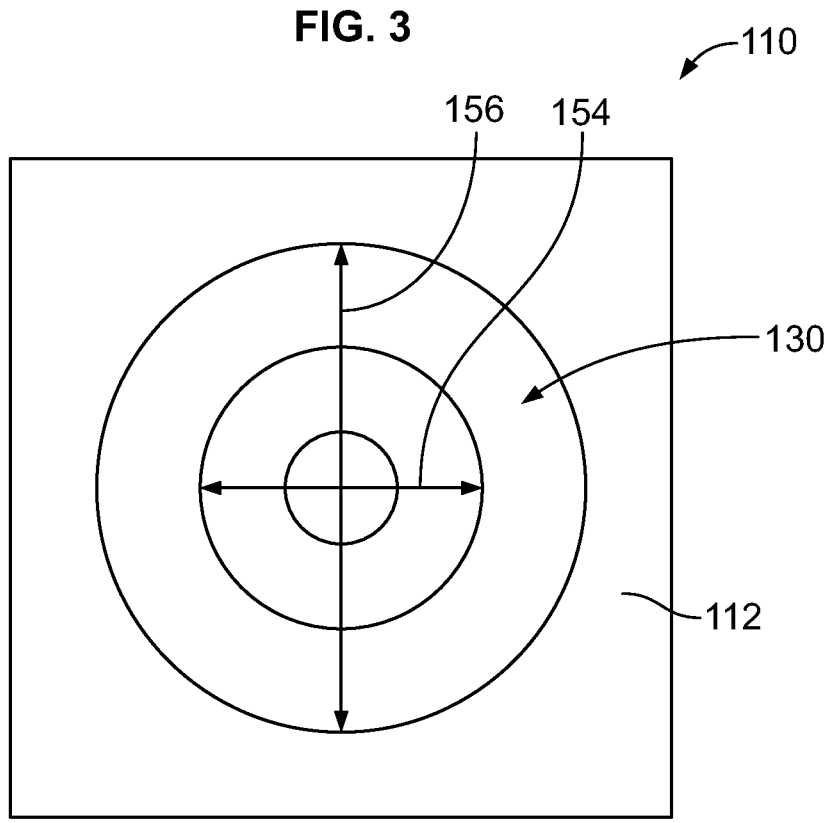
FIG. 4 is a bottom view of a portion of the PCB in accordance with an exemplary embodiment.

FIG. 4 is a bottom view of a portion of the PCB 110 in accordance with an exemplary embodiment. FIG. 4 illustrates the anti-pad 130 as a stamped, cylindrical structure. The anti-pad 130 has a circular cross-section. In alternative embodiments, the anti-pad 130 may have other shapes, such as an oval cross-section. In an exemplary embodiment, the anti-pad 130 has a variable width (for example, diameter). For example, the anti-pad 130 has a first width 154 along a portion thereof and a second width 156 along a different portion thereof. In the illustrated embodiment, the first width 154 is narrower than the second width 156. The anti-pad 130 may have the first width 154 along one or more layers of the substrate 112 and the second width 156 along one or more layers of the substrate 112.

Figure 5:
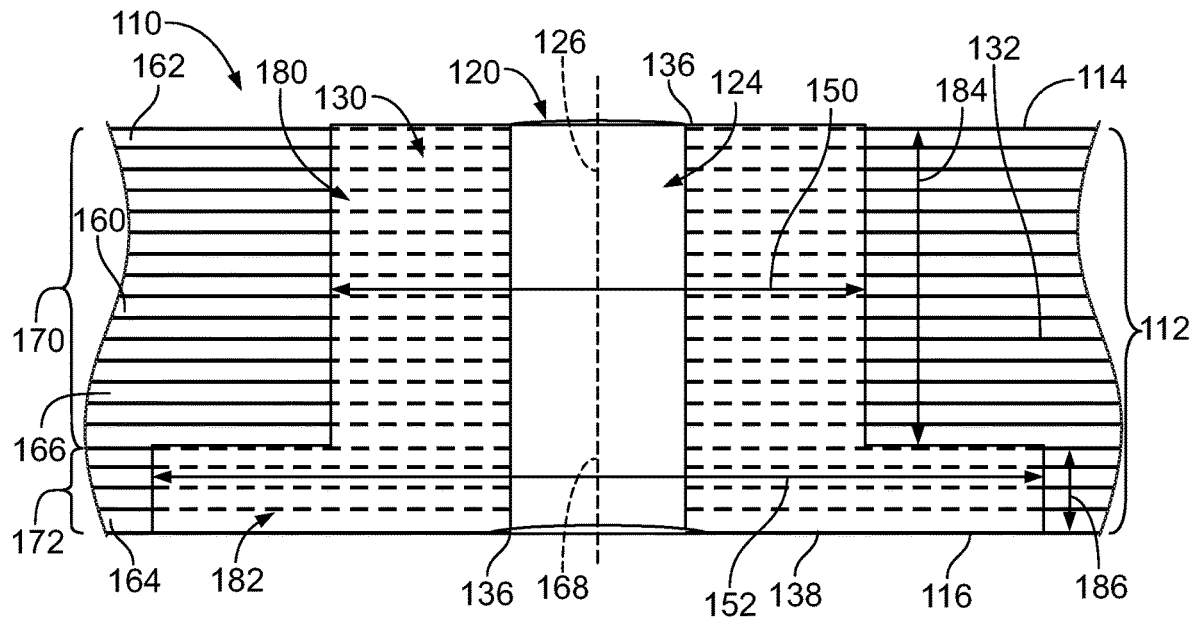
FIG. 5 is a cross-sectional view of a portion of the PCB in accordance with an exemplary embodiment.

FIG. 5 is a cross-sectional view of a portion of the PCB 110 in accordance with an exemplary embodiment. FIG. 5 illustrates the signal via 124 and the anti-pad 130 around the signal via 124 extending through the stack of circuit board layers 160. The stack of circuit board layers 160 includes an upper circuit board layer 162 at the top surface 114 and a lower circuit board layer 164 at the bottom surface 116. The stack of circuit board layers 160 includes intermediate circuit board layers 166 between the upper and lower circuit board layers 162, 164.

The anti-pad 130 is a stepped structure through the stack of circuit board layers 160 surrounding the signal via 124. The shape of the anti-pad 130 controls the impedance of the signal transmission lines through the signal via 124 by varying the distance or spacing between the signal via 124 and the ground planes 132 or other ground structures within the substrate 112. For example, the widths of the various portions of the anti-pad 130 and/or the heights of the various portions of the anti-pad 130 may be selected at the design phase of manufacturing the PCB 110 to control the impedance of the signal transmission line. Greater impedance control of the PCB 110 is provided at the anti-pad area of the substrate 112, as opposed to providing impedance control along the signal trace 138 using trace anti-pads as is typical of conventional PCB designs, which occupies and affects a larger footprint along the substrate 112.

In an exemplary embodiment, the substrate 112 includes an upper board stack 170 having a plurality of the circuit board layers 160 and a lower board stack 172 having a plurality of the circuit board layers 160. The upper board stack 170 includes the upper circuit board layer 162. The lower board stack 172 includes the lower circuit board layer 164. The anti-pad 130 passes through the upper board stack 170 and the lower board stack 172. The anti-pad 130 is stepped at the interface between the upper board stack 170 and the lower board stack 172 such that the anti-pad 130 has the first width 150 through the upper board stack 170 and the second width 152 through the lower board stack 172. In various embodiments, the substrate 112 may include additional board stacks, such as an intermediate board stack between the upper board stack 170 and the lower board stack 172, wherein the anti-pad 130 has a different width through the intermediate board stack(s).

The signal via 124 extends between corresponding signal pads 136 on the upper and lower circuit board layers 162, 164 at the top surface 114 and the bottom surface 116, respectively. The signal via 124 extends along the via axis 126. In an exemplary embodiment, a centroid axis 168 of the anti-pad 130 is coincident with the via axis 126. The signal trace 138 extends from the signal pad 136 on the lower circuit board layer 164 at the bottom surface 116 of the substrate 112; however, the signal trace 138 may extend from the signal pad 136 on the upper circuit board layer 162 or from an intermediate circuit board layer 166 in alternative embodiments. In an exemplary embodiment, one or more of the circuit board layers 160 include ground planes 132. However, the ground planes 132 do not extend into the anti-pad 130. The anti-pad 130 is devoid of ground planes 132.

The anti-pad 130 extends through the stack of circuit board layers 160 between the top surface 114 and the bottom surface 116. The anti-pad 130 is manufactured from a dielectric material, such as a glass fiber reinforced epoxy resin. In various embodiments, the anti-pad 130 is manufactured from an FR4 material. In other various embodiments, the anti-pad 130 may be manufactured from a polyamide material, a PTFE material, or another dielectric material. The anti-pad 130 may be manufactured from the same materials used to manufacture other areas of the circuit board layers 160 of the substrate 112.

In an exemplary embodiment, the anti-pad 130 includes an upper anti-pad 180 at the top surface 114 and a lower anti-pad 182 at the bottom surface 116. The upper anti-pad 180 extends through the upper board stack 170, including the upper circuit board layer 162. The lower anti-pad 182 extends through the lower board stack 172 including the lower circuit board layer 164. The upper anti-pad 180 has the first width 150 and the lower anti-pad 182 has the second width 152. In the illustrated embodiment, the second width 152 is wider than the first width 150. The upper anti-pad 180 has a first height 184 and the lower anti-pad 182 has a second height 186. The heights 184, 186 are defined by the thicknesses of the circuit board layers 160 and the number of circuit board layers 160 in the upper and lower anti-pads 180, 182, respectively. In the illustrated embodiment, the first height 184 is taller than the second height 186; however, the second height 186 may be taller than the first height 184 or the first and second heights 184, 186 may be equal in alternative embodiments. The first height 184 and the first width 150 are selected for impedance tuning of the signal contact 120. The second height 186 and the second width 152 are selected for impedance tuning of the signal contact 120.

Figure 6:
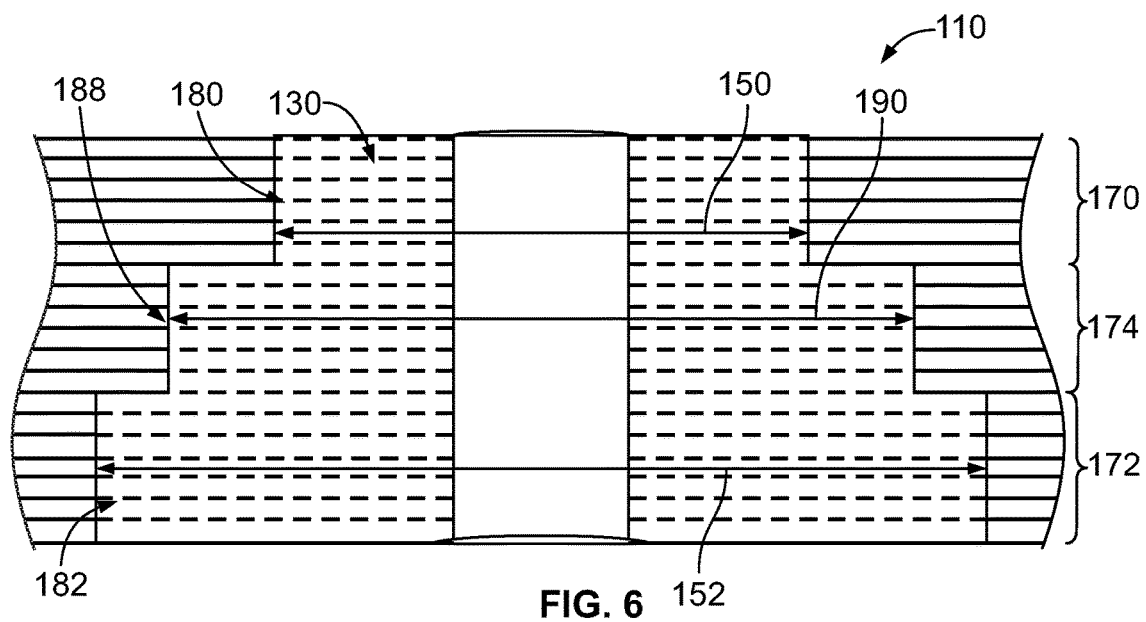
FIG. 6 is a cross-sectional view of a portion of the PCB in accordance with an exemplary embodiment.

FIG. 6 is a cross-sectional view of a portion of the PCB 110 in accordance with an exemplary embodiment. FIG. 6 illustrates the anti-pad 130 having the upper anti-pad 180, the lower anti-pad 182 and an intermediate anti-pad 188 between the upper anti-pad 180 and the lower anti-pad 182. The intermediate anti-pad 188 is located at an intermediate board stack 174 located between the upper board stack 170 and the lower board stack 172. The intermediate anti-pad 188 has a third width 190 different than the first width 150 and different from the second width 152. The anti-pad 130 is stepped between the upper anti-pad 180 and the intermediate anti-pad 188 and is stepped between the intermediate anti-pad 188 and the lower anti-pad 182. In the illustrated embodiment, the third width 190 is narrower than the second width 152 and wider than the first width 150. However, other arrangements are possible in alternative embodiments, such as with the third width 190 being the narrowest portion of the anti-pad 130 or the widest portion of the anti-pad 130. The anti-pad 130 may include additional intermediate anti-pad portions having different widths then adjacent anti-pad portions.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A printed circuit board comprising:
   a substrate having a plurality of stacked circuit board layers, the substrate having a top surface and a bottom surface;
   a signal contact on the substrate, the signal contact having a signal via and a signal trace extending from the signal via, the signal via extending between the top surface and the bottom surface along a via axis; and
   an anti-pad around the signal via extending through the substrate along the via axis, the anti-pad extending between the top surface and the bottom surface, the anti-pad having a first width at the top surface, the anti-pad having a second width at the bottom surface different than the first width, the anti-pad including an upper anti-pad at the top surface having the first width, a lower anti-pad at the bottom surface having the second width, and an intermediate anti-pad between the upper anti-pad and the lower anti-pad, the intermediate anti-pad having a third width different than the first width and different than the second width, the upper anti-pad comprising at least two of the circuit board layers, the lower anti-pad comprising at least two of the circuit board layers, the intermediate anti-pad comprising at least two of the circuit board layers.

2. The printed circuit board of claim 1, wherein the anti-pad has a stepped profile through the substrate with a varying width along a height of the anti-pad.

3. The printed circuit board of claim 1, wherein the upper anti-pad has a first height and the lower anti-pad has a second height different than the first height.

4. The printed circuit board of claim 3, wherein the first height and the first width are selected based on the second height and the second width for impedance tuning of the signal contact.

5. The printed circuit board of claim 1, wherein the substrate includes an upper board stack having a plurality of the circuit board layers and a lower board stack having a plurality of the circuit board layers, the anti-pad having the first width through the upper board stack and the anti-pad having the second width through the lower board stack.

6. The printed circuit board of claim 1, wherein the anti-pad is cylindrical.

7. The printed circuit board of claim 1, wherein the anti-pad is parallelepiped.

8. The printed circuit board of claim 1, further comprising a ground contact having a ground via extending through the substrate between the top surface and the bottom surface, the ground via positioned a first distance from the anti-pad at the top surface, the ground contact positioned a second distance from the anti-pad at the bottom surface, the second distance being different than the first distance.

9. The printed circuit board of claim 1, wherein the anti-pad has a centroid axis coincident with the via axis along a height of the substrate between the top surface and the bottom surface.

10. A printed circuit board comprising:
    a substrate having a top surface and a bottom surface, the substrate having a plurality of stacked circuit board layers including an upper board stack at the top surface and a lower board stack at the bottom surface;
    a signal contact on the substrate, the signal contact having a signal via and a signal trace extending from the signal via, the signal via including an upper via through the upper board stack and a lower via through the lower board stack, the upper via and the lower via being aligned along a via axis; and
    an anti-pad around the signal via extending through the substrate along the via axis, the anti-pad having an upper anti-pad aligned with the upper via and a lower anti-pad aligned with the lower via, the upper anti-pad having a first width, the lower anti-pad having a second width different than the first width, wherein the anti-pad includes an intermediate anti-pad between the upper anti-pad and the lower anti-pad, the intermediate anti-pad having a third width different than the first width and different than the second width, the intermediate anti-pad comprising at least two of the circuit board layers.

11. The printed circuit board of claim 10, wherein the anti-pad has a stepped profile through the substrate with a varying width along a height of the anti-pad.

12. The printed circuit board of claim 10, wherein the upper anti-pad has a first height and the lower anti-pad has a second height different than the first height.

13. The printed circuit board of claim 10, wherein the substrate includes an upper board stack having a plurality of the circuit board layers and a lower board stack having a plurality of the circuit board layers, the upper anti-pad extending through the upper board stack and the lower anti-pad extending through the lower board stack.

14. The printed circuit board of claim 10, further comprising a ground contact having a ground via extending through the substrate between the top surface and the bottom surface, the ground via positioned a first distance from the anti-pad at the top surface, the ground contact positioned a second distance from the anti-pad at the bottom surface, the second distance being different than the first distance.

15. The printed circuit board of claim 10, wherein the anti-pad has a centroid axis coincident with the via axis through the upper board stack and through the lower board stack.

16. An electrical connector assembly comprising:
    an electrical connector including a housing holding signal contacts and ground contacts, the housing having a mounting end; and
    a printed circuit board supporting the electrical connector, the printed circuit board including a substrate having a plurality of stacked circuit board layers, the substrate having a top surface and a bottom surface, the mounting end of the electrical connector being mounted to the top surface of the substrate, the printed circuit board including signal contacts and ground contacts, the signal contacts of the printed circuit board being electrically coupled to corresponding signal contacts of the electrical connector, the ground contacts of the printed circuit board being electrically coupled to corresponding ground contacts of the electrical connector, each signal contact having a signal via extending between the top surface and the bottom surface along a via axis and a signal trace extending from the signal via, the printed circuit board including anti-pads around the corresponding signal vias, the anti-pads extending through the substrate along the corresponding via axis between the top surface and the bottom surface, the anti-pads having stepped profiles through the substrate with varying widths along the heights of the anti-pads, wherein the anti-pad includes an upper anti-pad at the top surface having the first width, a lower anti-pad at the bottom surface having the second width, and an intermediate anti-pad between the upper anti-pad and the lower anti-pad having a third width different than the first width and different than the second width.

17. The electrical connector assembly of claim 16, wherein each anti-pad has a first width at the top surface and a second width at the bottom surface different than the first width.

18. The electrical connector assembly of claim 16, wherein each of the corresponding ground contacts includes a ground via extending between the top surface and the bottom surface, the ground via positioned a first distance from the anti-pad at the top surface, the ground contact positioned a second distance from the anti-pad at the bottom surface, the second distance being different than the first distance.

19. The electrical connector assembly of claim 16, wherein the anti-pads each having a centroid axis coincident with the corresponding via axis along a height of the substrate between the top surface and the bottom surface.

\* \* \* \* \*